(12) United States Patent
Miao et al.

(10) Patent No.: US 10,418,550 B2
(45) Date of Patent: Sep. 17, 2019

(54) HIGH TEMPERATURE RESISTANT MEMRISTOR BASED ON TWO-DIMENSIONAL COVALENT CRYSTAL AND PREPARATION METHOD THEREOF

(71) Applicant: Nanjing University, Nanjing (CN)

(72) Inventors: Feng Miao, Nanjing (CN); Miao Wang, Nanjing (CN)

(73) Assignee: Nanjing University, Nanjing (CN)

( * ) Notice: Subject to any disclaimer, the term of this patent is extended or adjusted under 35 U.S.C. 154(b) by 0 days.

(21) Appl. No.: 15/992,026

(22) Filed: May 29, 2018

(65) Prior Publication Data
US 2018/0277754 A1    Sep. 27, 2018

(51) Int. Cl.
*G11C 13/00*    (2006.01)
*H01L 45/00*    (2006.01)

(52) U.S. Cl.
CPC .......... *H01L 45/08* (2013.01); *G11C 13/0007* (2013.01); *H01L 45/145* (2013.01); *H01L 45/1616* (2013.01); *H01L 45/1625* (2013.01); *G11C 2213/15* (2013.01); *G11C 2213/55* (2013.01)

(58) Field of Classification Search
CPC ........................ G11C 11/1675; G11C 13/0069
USPC .................................................. 365/148, 158
See application file for complete search history.

(56) References Cited

U.S. PATENT DOCUMENTS

| | | | | |
|---|---|---|---|---|
| 8,557,643 | B2 * | 10/2013 | Han | H01L 29/42384 257/203 |
| 8,658,463 | B2 * | 2/2014 | Nickel | H01L 45/08 257/143 |
| 9,035,272 | B2 * | 5/2015 | Sheng | H01L 45/1608 257/1 |
| 9,263,260 | B1 * | 2/2016 | Basu | H01L 21/0259 |
| 9,558,929 | B2 * | 1/2017 | Redepenning | H01L 21/02118 |
| 9,831,427 | B1 * | 11/2017 | Haase | H01L 45/12 |
| 9,887,351 | B1 * | 2/2018 | Ando | H01L 45/1608 |
| 9,904,144 | B1 * | 2/2018 | Song | G02F 1/3521 |
| 10,096,773 | B1 * | 10/2018 | Ando | H01L 45/1233 |
| 10,154,326 | B2 * | 12/2018 | Mazed | H04B 10/272 |
| 10,256,272 | B2 * | 4/2019 | Yoshida | H01L 27/2454 |
| 10,256,402 | B1 * | 4/2019 | Rajamohanan | H01L 45/1233 |

(Continued)

OTHER PUBLICATIONS

The Graphene Experts, Graphene: Structure and Shape, Dec. 31, 2018, https://www.graphene-info.com/graphene-structure-and-shape (Year: 2018).*

(Continued)

*Primary Examiner* — Michael T Tran
(74) *Attorney, Agent, or Firm* — CBM Patent Consulting, LLC

(57) ABSTRACT

A high temperature resistant memristor comprises a bottom electrode, a dielectric and a top electrode, wherein the dielectric is a two-dimensional covalent crystal material or a two-dimensional covalent crystal material doped with oxygen or sulfur which has (1) the two-dimensional covalent crystal material or the two-dimensional covalent crystal material doped with oxygen or sulfur is adopted as the dielectric; (2) a memristor prepared by utilizing relatively high thermal stability of a lattice structure of two-dimensional transition metal; and (3) the high temperature resistant memristor.

12 Claims, 7 Drawing Sheets

(56) References Cited

U.S. PATENT DOCUMENTS

| | | | | |
|---|---|---|---|---|
| 2004/0020423 | A1* | 2/2004 | Lewis, III | B82Y 20/00 117/8 |
| 2011/0017977 | A1* | 1/2011 | Bratkovski | H01L 45/08 257/14 |
| 2011/0182103 | A1* | 7/2011 | Smythe | H01L 45/145 365/148 |
| 2011/0240951 | A1* | 10/2011 | Yang | H01L 27/2463 257/5 |
| 2014/0027700 | A1* | 1/2014 | Nickel | H01L 45/08 257/3 |
| 2014/0113176 | A1* | 4/2014 | Muramatsu | H01M 2/1646 429/145 |
| 2014/0175604 | A1* | 6/2014 | Barabash | H01L 28/40 257/532 |
| 2014/0291602 | A1* | 10/2014 | Kenyon | G11C 13/0002 257/4 |
| 2014/0312292 | A1* | 10/2014 | Pickett | H01L 28/24 257/3 |
| 2014/0332746 | A1* | 11/2014 | Monaghan | H01L 21/28194 257/2 |
| 2015/0083582 | A1* | 3/2015 | Dhindsa | H01L 21/3065 204/192.37 |
| 2016/0064715 | A1* | 3/2016 | Honda | H01M 2/18 429/145 |
| 2017/0047512 | A1* | 2/2017 | Bessonov | H01G 7/06 |
| 2017/0114450 | A1* | 4/2017 | Babenko | C23C 16/003 |
| 2017/0124025 | A1* | 5/2017 | Gokmen | G06F 15/7867 |
| 2017/0216923 | A1* | 8/2017 | Babenko | B01J 35/0006 |
| 2017/0217168 | A1* | 8/2017 | Ge | B41J 2/14129 |
| 2017/0358352 | A1* | 12/2017 | Ge | G11C 13/0007 |
| 2017/0371224 | A1* | 12/2017 | Seeboth | G02F 1/133711 |
| 2018/0022103 | A1* | 1/2018 | Ge | B41J 2/14016 347/20 |
| 2018/0040911 | A1* | 2/2018 | Matsuzaki | H01M 2/16 |
| 2018/0148338 | A1* | 5/2018 | Yu | C01B 32/194 |
| 2018/0253643 | A1* | 9/2018 | Buchanan | G06N 3/0635 |
| 2018/0286916 | A1* | 10/2018 | Wang | H01L 45/04 |
| 2018/0301187 | A1* | 10/2018 | Ignowski | G11C 7/02 |
| 2018/0375021 | A1* | 12/2018 | Wang | H01L 45/04 |
| 2019/0103467 | A1* | 4/2019 | Takaki | H01L 29/41741 |

OTHER PUBLICATIONS

Goerbig et al., Introduction to the Physical Properties of Graphene, 2008, http://web.physics.ucsb.edu/~phys123B/w2015/pdf_CoursGraphene2008.pdf (Year: 2008).*

* cited by examiner

HIGH TEMPERATURE RESISTANT MEMRISTOR BASED ON TWO-DIMENSIONAL COVALENT CRYSTAL AND PREPARATION METHOD THEREOF

TECHNICAL FIELD

The present invention relates to a memristor and a preparation method thereof, and more particularly relates to a high temperature resistant memristor based on two-dimensional covalent crystal and a preparation method thereof.

BACKGROUND ART

A memristor is a circuit device expressing a relationship between magnetic flux and electric charge, the memristor has the dimension of a resistor, but is different from the resistor in that the resistance value of the memristor is determined by electric charge flowing through the memristor. The memristor has multiple excellent characteristics of nanoscale dimension, a multi-resistance state switch, ultra-high switching speed, ultrahigh switching times and very good CMOS compatibility. Therefore, the memristor shows great potential in application to storage and neuron-like computation in the future. Most of existing research for the memristor is concentrated on improvement of the switching property of the device, and has achieved good progress. However, the problem of stability of the memristor in an extreme environment (such as the high temperature resistant property) still needs to be solved.

The structure of an existing memristor based on an oxide material is as follows: a top electrode/a tunneling layer/an oxide layer/an ion doping layer/a bottom electrode; in the switching process, due to migration of ions and change of ion valence state, ions in the device material can hardly maintain the original state at a high temperature, thus causing failure of the device. In the industries such as spaceflight, military, geological prospecting and petroleum and gas drilling, it is required that electronic elements can steadily work at the temperature higher than 300° C., while the highest working temperature of the existing memristor is 200° C., and therefore, the potential application of the memristor in an electronic element circuit at an extreme environment is limited to a great extent, and finding of a new material and a new structure for preparing the memristor is of great significance.

SUMMARY OF THE INVENTION

Aims of the present invention: the first aim of the present invention is to provide a high temperature resistant memristor based on two-dimensional covalent crystal; the second aim of the present invention is to provide a preparation method of the high temperature resistant memristor.

Technical scheme: the present invention provides a high temperature resistant memristor based on two-dimensional covalent crystal, the high temperature resistant memristor is of a structure comprising a bottom electrode, a dielectric and a top electrode, wherein the dielectric is a two-dimensional covalent crystal material or a two-dimensional covalent crystal material doped with oxygen or sulfur.

The two-dimensional covalent crystal material is a two-dimensional covalent crystal material that can keep the original crystal structure at a temperature of higher than or equal to 500° C., that is, the material has relatively high stability and does not decompose or generate phase changes at the temperature of higher than or equal to 500° C. The two-dimensional covalent crystal material or the doped two-dimensional covalent crystal material is of any type, and needs to meet the following conditions: (i) being not soluble in water and acetone, and being not soluble in photoresist; (ii) being incapable of generating chemical reaction with acetone and photoresist; and (iii) having relatively high stability at high temperature, and being capable of keeping the original crystal structure at the high temperature. The two-dimensional covalent crystal material is preferably transition metal chalcogenide or black phosphorus.

The doping amount of oxygen or sulfur in the two-dimensional covalent crystal material is x, and x is more than 0% and less than 50%; preferably, x is more than or equal to 10% and less than or equal to 20%, wherein x is the proportion of the quantity of doped atoms.

The dielectric is prepared by adopting a method of chemical vapor deposition (CVD), chemical vapor transportation (CVT) or molecular beam epitaxy (MBE).

The bottom electrode and the top electrode of the present invention are prepared by adopting an inert metal material, a conducting material or a semimetal two-dimensional covalent crystal material, that is, the bottom electrode is prepared by adopting an inert metal material, a conducting material or a semimetal two-dimensional covalent crystal material, the top electrode is prepared by adopting an inert metal material, a conducting material or a semimetal two-dimensional covalent crystal material, and the materials of the bottom electrode and the top electrode may be different. The inert metal material is platinum, gold or palladium, the conducting material is indium tin oxide or titanium nitride, and the semimetal two-dimensional covalent crystal material is graphene.

A method for preparing a high temperature resistant memristor based on two-dimensional covalent crystal comprises the following steps: preparing the bottom electrode on a substrate, transferring the prepared two-dimensional covalent crystal material or the two-dimensional covalent crystal material doped with oxygen or sulfur to the bottom electrode to be used as a dielectric, and then preparing the top electrode on the dielectric. The specific steps are as follows:

(1) preparing the bottom electrode on the substrate by adopting a physical vapor deposition or magnetron sputtering method when an inert metal material or a flexible conducting material is adopted as the bottom electrode and the top electrode, preparing a dielectric by adopting a method of chemical vapor deposition, chemical vapor transportation or molecular beam epitaxy, transferring the dielectric to the bottom electrode, and then preparing the top electrode; and (2) preparing the bottom electrode and the top electrode by adopting a mechanical stripping method or a chemical vapor deposition method when a semimetal type two-dimensional covalent crystal material is adopted as the bottom electrode and the top electrode, transferring the bottom electrode to the substrate, preparing a dielectric by adopting a method of chemical vapor deposition, chemical vapor transportation or molecular beam epitaxy, transferring the dielectric to the bottom electrode, and then transferring the top electrode to the dielectric.

A doping process of the method for preparing a high temperature resistant memristor based on two-dimensional covalent crystal may further comprise the following steps:

(1) preparing a bottom electrode on a substrate by adopting a physical vapor deposition or magnetron sputtering method when an inert metal material or a flexible conducting material is adopted as the bottom electrode and the top electrode, preparing a precursor of a two-dimensional covalent crystal material by adopting a method of chemical vapor deposition, chemical vapor transportation or molecular beam epitaxy, then doping the two-dimensional covalent crystal material by using a doping process to obtain a dielectric, transferring the dielectric to the bottom electrode, and then preparing the top electrode; and (2) preparing the bottom electrode and the top electrode by adopting a mechanical stripping method or a chemical vapor deposition method when a semimetal type two-dimensional covalent crystal material is adopted as the bottom electrode and the top electrode, transferring the bottom electrode to the substrate, preparing a precursor of the two-dimensional covalent crystal material by adopting a method of chemical vapor deposition, chemical vapor transportation or molecular beam epitaxy, then doping the two-dimensional covalent crystal material by using a doping process to obtain a dielectric, transferring the dielectric to the bottom electrode and then transferring the top electrode to the dielectric.

For the preparation of the electrode material: 1. For a conducting material prepared by adopting a method of physical vapor deposition or magnetron sputtering, such as insert metal or a conducting compound, wherein the inert metal may be gold, platinum or palladium, and the conducting compound may be titanium nitride, firstly, the substrate is coated with a layer of photoresist in a spinning way, a self-defined electrode pattern is exposed at a designated spot on the substrate by adopting a manner of electron beam lithography or ultraviolet lithography (the required electrode pattern is exposed, and the rest part is covered by photoresist), and the pattern is developed by using a developing solution; then a layer of conducting material film grows on the substrate with prepared pattern by adopting a manner of electron beam evaporation, thermal evaporation or magnetron sputtering; and finally, the substrate is put into an acetone solution, redundant photoresist is dissolved by acetone, then the conducting material film on the surface of the redundant photoresist falls off from the substrate, and then a conducting film electrode with designed pattern is left on the substrate. 2. For a conducting material prepared by adopting a mechanical stripping method or a chemical vapor deposition method, such as a semimetal type two-dimensional covalent crystal material, firstly, a single-layer, multi-layer or thick-layer semimetal type two-dimensional covalent crystal film is prepared on the substrate, the substrate is coated with a layer of photoresist in a spinning way, a self-defined electrode pattern is exposed at a designated spot on graphene by adopting a manner of electron beam lithography or ultraviolet lithography (the required electrode pattern is exposed, and the rest part is covered by photoresist), and the pattern is developed by using a developing solution; then redundant semimetal type two-dimensional covalent crystal is etched by adopting a manner of plasma etching, and the semimetal type two-dimensional covalent crystal material with required electrode pattern covered by photoresist is left; the substrate is put into an acetone solution, residual photoresist is dissolved by acetone, and the semimetal type two-dimensional covalent crystal film electrode with designed pattern is left on the substrate; and finally, the prepared semimetal type two-dimensional covalent crystal film electrode is transferred to a required position on a sample of the memristor.

For preparation of the two-dimensional covalent crystal material or the doped two-dimensional covalent crystal material: 1. the required two-dimensional covalent crystal material film can be directly prepared by adopting the two-dimensional covalent crystal material via a method of chemical vapor deposition (CVD) or molecular beam epitaxy (MBE), or block materials of the two-dimensional covalent crystal is firstly prepared by adopting (chemical vapor transmission) CVT and then the two-dimensional covalent crystal material film is obtained by using a method of mechanical stripping or ultrasonic spin coating. 2. The required doped two-dimensional covalent crystal material film can be directly prepared by adopting the doped two-dimensional covalent crystal material via a method of chemical vapor deposition (CVD) or molecular beam epitaxy (MBE), or block materials of the doped two-dimensional covalent crystal is firstly prepared by adopting (chemical vapor transmission) CVT and then the doped two-dimensional covalent crystal material film is obtained by using a method of mechanical stripping or ultrasonic spin coating; or the two-dimensional covalent crystal material firstly grows by adopting a method of chemical vapor deposition (CVD), (chemical vapor transmission) CVT or molecular beam epitaxy (MBE), so as to be taken as a precursor of the doped two-dimensional covalent crystal material, then the two-dimensional covalent crystal material is doped by using a doping process, and finally the doped two-dimensional covalent crystal material is obtained. The doping process may be specifically processes such as gas and liquid chemical reaction doping or plasma bombardment doping.

Beneficial effects: compared with the prior art, the present invention has the following advantages: (1) the two-dimensional covalent crystal material or the two-dimensional covalent crystal material doped with oxygen or sulfur is adopted as the dielectric, so that the prepared high temperature resistant memristor has excellent electrical switching property and relatively high working temperature, and can steadily work at the high temperature up to 340° C., the switching life can reach 1000 times, and the state maintaining time can reach longer than $10^5$ s. (2) By utilizing ultrahigh thermal stability of a lattice structure of two-dimensional transition metal chalcogenide, the prepared high temperature resistant memristor has the switching life up to $10^7$ times maximally, switching speed of lower than $10^{-7}$ s, and state maintaining time of longer than $10^5$ s. (3) The high temperature resistant memristor has the advantages of being economical and simple and easy, and is suitable for large-scale industrial production.

DETAILED DESCRIPTION OF THE INVENTION

The technical scheme of the present invention will be further illustrated in combination with drawings in the followings.

Embodiment 1

(1) Preparation of a graphene bottom electrode: stripping a graphene film to the surface of an $SiO_2$/Si substrate by using a mechanical stripping method, wherein the film thickness is about 10 nm; then coating the substrate with a layer of photoresist in a spinning way by using a spin coater at the speed of 4000 r/min, wherein PMMA is adopted for the photoresist of the embodiment; exposing a stripe electrode pattern (the required electrode pattern is covered by photoresist, the remaining part is exposed, and the stripe width is 1 micrometer) in a designated position on graphene by using a method of electron beam lithography, and developing the pattern by using a PMMA developing solution; then etching redundant graphene by using a manner of plasma etching, wherein graphene with required electrode pattern covered by photoresist is left; putting the substrate into an acetone solution, and dissolving residual photoresist with acetone, wherein what is left on the substrate is a stripe graphene film electrode; and finally, transferring the prepared semimetal two-dimensional covalent crystal film electrode to the substrate, wherein the transferring method can refer to a method disclosed by the document "Graphene transfer: key for applications" of Junmo Kang et al (Nanoscale, 2012, 4, 5527).

(2) Preparation and transfer of oxygen doped molybdenum disulfide dielectric: firstly growing a molybdenum disulfide block material by using a method of chemical vapor transmission (CVT); then stripping a molybdenum disulfide film from the growing molybdenum disulfide block material to the surface of the $SiO_2$/Si substrate by using a mechanical stripping method, wherein the thickness of the film is about 40 nm; putting the molybdenum disulfide film to a heating table of 160° C. in the air, taking down after 1.5 hours, and transferring the oxygen doped molybdenum disulfide film on the substrate to the graphene bottom electrode prepared in step (1), wherein the transferring method can refer to a method disclosed by the document "Graphene transfer: key for applications" of Junmo Kang et al (Nanoscale, 2012, 4, 5527).

Figure 1:
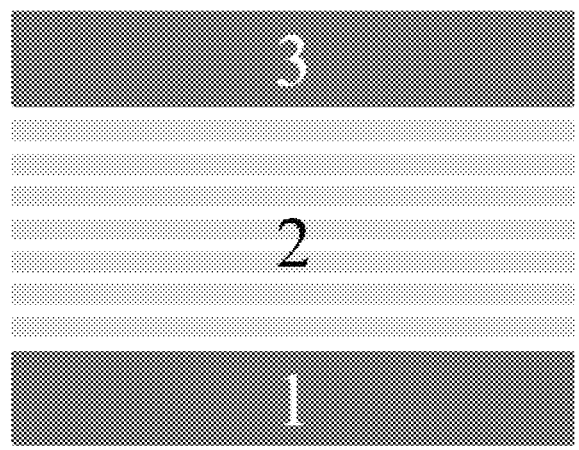
FIG. 1 is a structural diagram of the device of the present invention.

(3) Preparation and transfer of a graphene top electrode: the preparation method of the graphene top electrode is the same as that in step (1), and after the preparation is completed, the prepared graphene film electrode is transferred to an oxygen doped molybdenum disulfide dielectric layer prepared in step (2) to be used as the top electrode, so as to obtain the memristor of the structure of graphene/oxygen doped molybdenum disulfide/graphene. In the embodiment, the doping amount of oxygen is 15%, that is, 15%=oxygen atom number/(oxygen atom number+sulfur atom number). The structural diagram of the device is as shown in FIG. 1, the two-dimensional covalent crystal material is located in the middle of the device and sandwiched by a top electrode 3 and a bottom electrode 1 to be used as a dielectric 2, so as to form a device of a sandwich structure.

Figure 2:
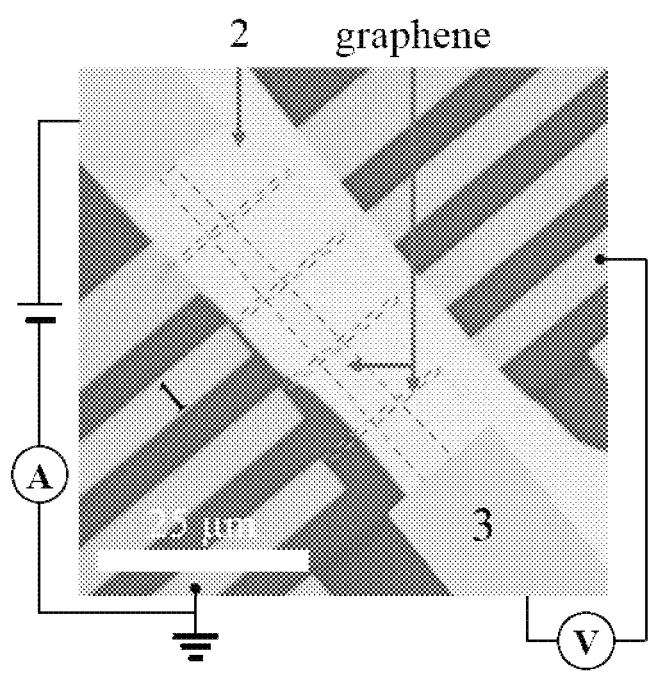
FIG. 2 is an optical microscope photograph and a measuring circuit diagram of a graphene electrode device in an embodiment 1 of the present invention.
Figure 3:
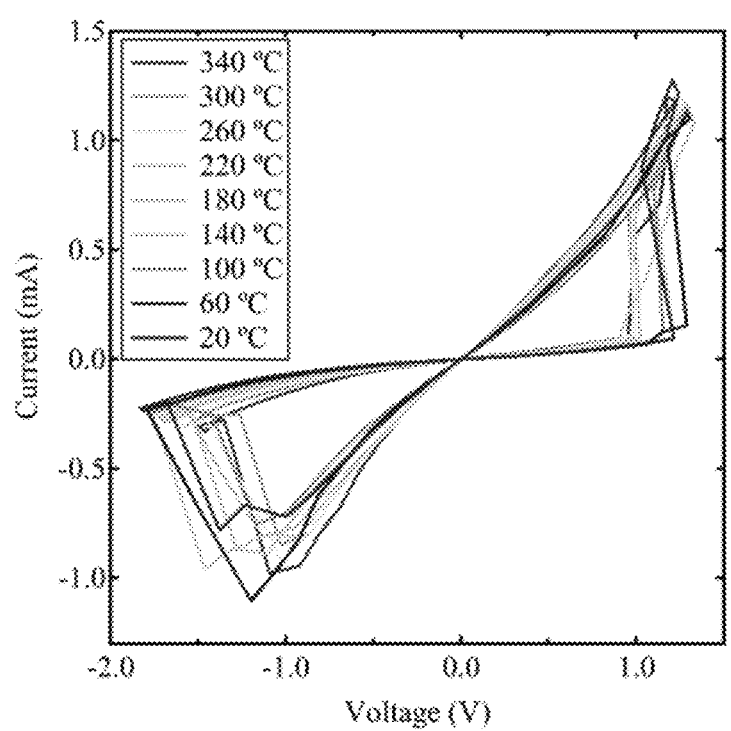
FIG. 3 is a switching curve graph of the graphene electrode device at different temperatures in the embodiment 1 of the present invention.
Figure 4:
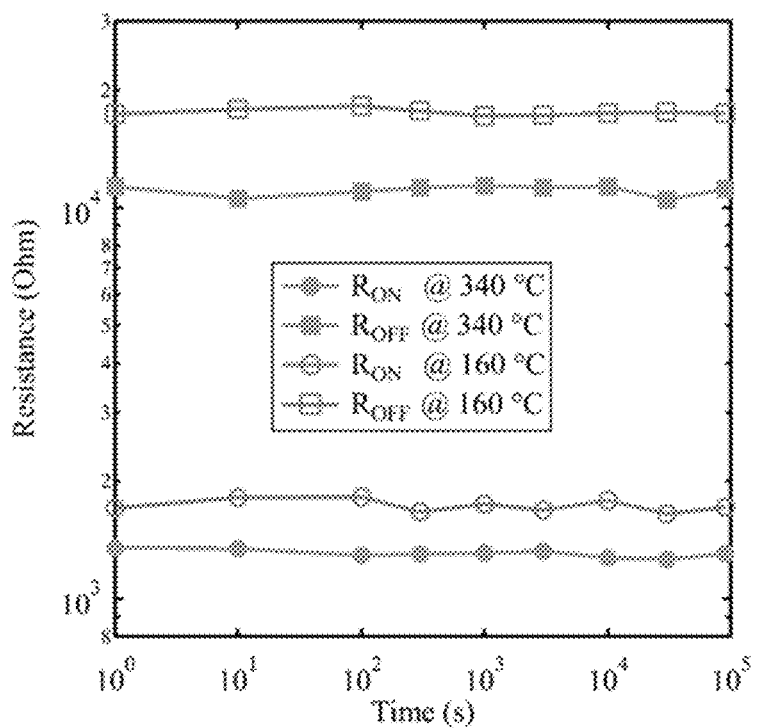
FIG. 4 is a state maintaining time diagram of high and low resistance states of the graphene electrode device at the temperatures of 340° C. and 160° C.

(4) Graphene bottom electrode and top electrode in the device prepared in step (3) are led out by a metal film electrode via a method of electron beam lithography and electron beam evaporation, so as to facilitate subsequent integration and measurement. The optical microscope photograph and the measuring circuit diagram of the device of the embodiment are as shown in FIG. 2. The switching curve graph of the device at different temperatures in the embodiment is as shown in FIG. 3, a state maintaining time diagram of high and low resistance states of the device at the temperatures of 340° C. and 160° C. is as shown in FIG. 4, it can be known from FIG. 3 and FIG. 4 that a memristor of a sandwich structure using a two-dimensional covalent crystal material can steadily work at the temperature up to 340° C., thus creating a new record of the working temperature of the memristor (the higher record reported previously is 200° C.). The switching curve at a high temperature can still keep a shape almost the same as a curve at the room temperature, indicating that the memristor not only can adapt to high temperature, but also can adapt to severe temperature variation. Meanwhile, the memristor can still keep high and low resistance state maintaining time of relatively long time at the high temperature of 340° C., indicating that the memristor not only can be steadily switched at the high temperature, but also can maintain the high and low resistance state for a relatively long time, and thus being capable of effectively storing information at the high temperature, which further indicates the stability of the memristor at the high temperature.

Measured by using a semiconductor device analyzer Agilent B1500A, at the temperature of 340° C., the device prepared according to the embodiment has the switching life reaching 1000 times, and the state maintaining time reaching longer than $10^5$ s; and the prepared high temperature resistant memristor has switching life reaching $10^7$ times maximally, switching speed reaching shorter than $10^{-7}$ s, and state maintaining time reaching longer than $10^5$ s.

In conclusion, the memristor prepared by adopting the method disclosed by the present invention has excellent high temperature resistant property.

Embodiment 2

(1) Preparation of a gold bottom electrode: firstly coating the substrate with a layer of PMMA in a spinning way by using a spin coater at the speed of 4000 r/min, exposing a stripe electrode pattern (the required electrode pattern is covered by photoresist, the remaining part is exposed, and the stripe width is 1 micrometer) in a designated position on the substrate by using a method of electron beam lithography, and developing the pattern by using a developing solution; then growing a layer of gold film on the substrate by using a manner of electron beam evaporation, wherein the thickness of the film is about 40 nm; and finally, putting the substrate into an acetone solution, and dissolving residual PMMA photoresist with acetone, wherein the gold film on the surface of the redundant photoresist falls off from the substrate accordingly, and what is left on the substrate is a stripe graphene film electrode.

(2) Preparation and transfer of oxygen doped molybdenum disulfide dielectric: firstly growing a molybdenum disulfide block material by using a method of chemical vapor transmission (CVT); then stripping a molybdenum disulfide film from the growing molybdenum disulfide block material to the surface of the SiO$_2$/Si substrate by using a mechanical stripping method, wherein the thickness of the film is about 40 nm; putting the molybdenum disulfide film to a heating table of 160° C. in the air, taking down after 1.5 hours, and transferring the oxygen doped molybdenum disulfide film on the substrate to the graphene bottom electrode prepared in step (1), wherein the oxygen doping amount of the embodiment is 15%. The transferring method can refer to a method disclosed by the document "*Graphene transfer: key for applications*" of Junmo Kang et al (Nanoscale, 2012, 4, 5527).

Figure 5:
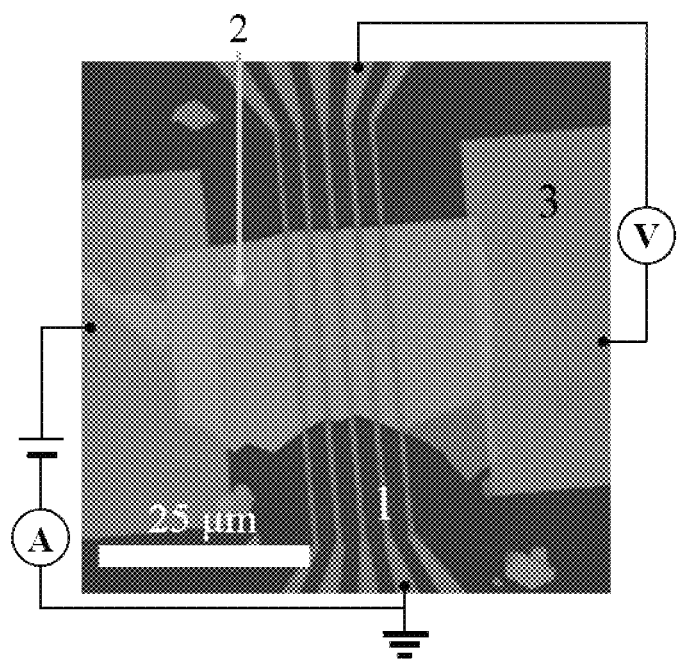
FIG. 5 is an optical microscope picture and a measuring circuit diagram of a gold electrode device in an embodiment 2 of the present invention.

(3) Preparation of a gold top electrode: the preparation method of the gold top electrode is the same as that in step (1), and after preparation of the gold top electrode is completed, the memristor of a gold/oxygen doped molybdenum disulfide/gold structure can be obtained. The optical microscope photograph and the measuring circuit diagram of the device in the embodiment are as shown in FIG. 5.

Figure 6:
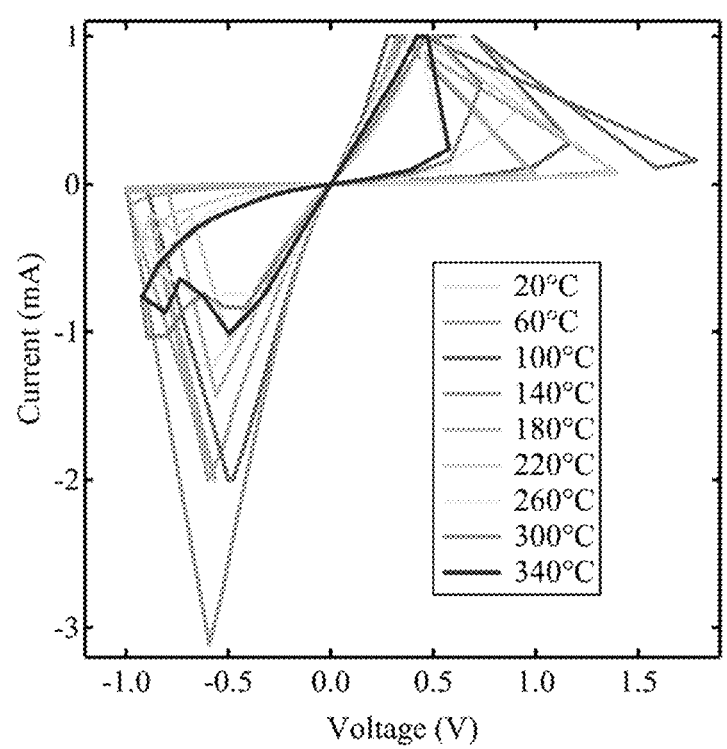
FIG. 6 is a switching curve graph of the gold electrode device at different temperatures in the embodiment 2 of the present invention.
Figure 7:
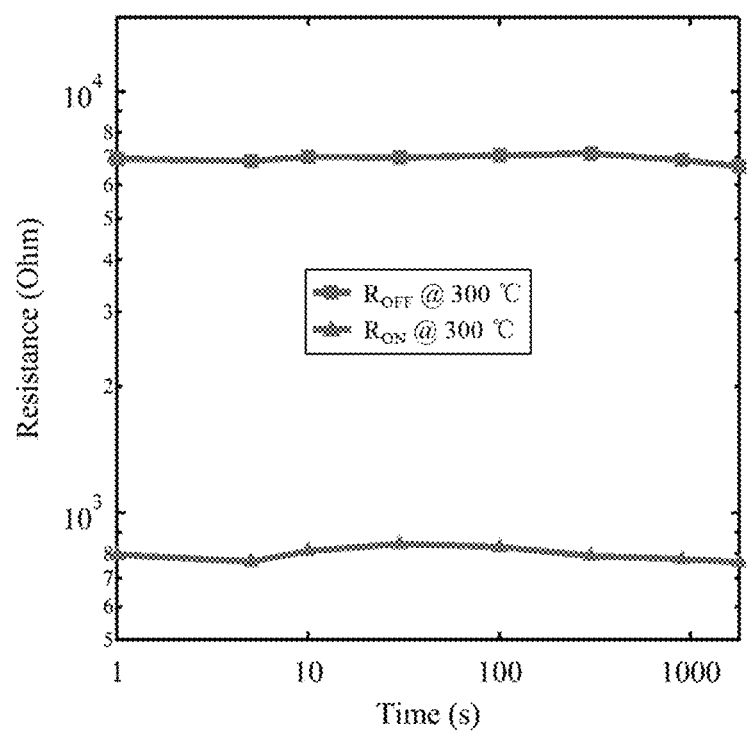
FIG. 7 is a state maintaining time diagram of high and low resistance states of the gold electrode device at the temperature of 340° C.

The switching curve graph of the device at different temperatures in the embodiment is as shown in FIG. 6, and a state maintaining time diagram of high and low resistance states of the device at the temperature of 340° C. in the embodiment is as shown in FIG. 7. It can be seen from FIG. 6 and FIG. 7 that a memristor of a sandwich structure using a two-dimensional covalent crystal material can steadily work at a temperature reaching 340° C. maximally, which creates a new record of the working temperature of the memristor (the higher record reported previously is 200° C.). The switching curve at a high temperature can still keep a shape almost the same as a curve at the room temperature, indicating that the memristor not only can adapt to high temperature, but also can adapt to severe temperature variation. Meanwhile, the memristor can still keep high and low resistance state maintaining time of relatively long time at the high temperature of 340° C., indicating that the memristor not only can be steadily switched at the high temperature, but also can maintain the high and low resistance state for a relatively long time, and thus being capable of effectively storing information at the high temperature, which further indicates the stability of the memristor at the high temperature. In conclusion, the memristor prepared by adopting the method disclosed by the present invention has excellent high temperature resistant property.

Embodiment 3

(1) The preparation of a graphene bottom electrode is the same as embodiment 1.

(2) Preparation and transfer of an oxygen doped molybdenum disulfide dielectric: growing an oxygen doped molybdenum disulfide film by using a method of chemical vapor deposition (CVD), wherein the thickness of the film is about 40 nm; and then transferring the growing oxygen doped molybdenum disulfide film to the graphene bottom electrode prepared in step (1), wherein the transferring method can refer to a method disclosed by the document "*Graphene transfer: key for applications*" of Junmo Kang et al (Nanoscale, 2012, 4, 5527).

Steps (3)-(4) are the same as steps (3)-(4) of embodiment 1.

Embodiment 4

(1) The preparation of a gold bottom electrode is the same as embodiment 2.

(2) Preparation and transfer of an oxygen doped molybdenum disulfide dielectric: growing an oxygen doped molybdenum disulfide film by using a method of chemical vapor deposition (CVD), wherein the thickness of the film is about 40 nm; and then transferring the growing oxygen doped molybdenum disulfide film to the gold bottom electrode prepared in step (1), wherein the transferring method can refer to a method disclosed by the document "*Graphene transfer: key for applications*" of Junmo Kang et al (Nanoscale, 2012, 4, 5527).

Step (3) is the same as step (3) of embodiment 2.

Embodiment 5

(1) Preparation of a graphene bottom electrode is the same as embodiment 1.

(2) Preparation and transfer of a tungsten disulfide dielectric: firstly growing a tungsten disulfide block material by using a method of chemical vapor transmission (CVT); then stripping a tungsten disulfide film from the growing tungsten disulfide block material to the surface of the SiO$_2$/Si substrate by using a mechanical stripping method; then transferring the tungsten disulfide film on the substrate to the graphene bottom electrode prepared in step (1), wherein the transferring method can refer to a method disclosed by the document "*Graphene transfer: key for applications*" of Junmo Kang et al (Nanoscale, 2012, 4, 5527).

(3) Preparation and transfer of a graphene top electrode: the preparation method of the graphene top electrode is the same as that in step (1), and after preparation of the graphene top electrode is completed, the prepared graphene film electrode is transferred to the graphene bottom electrode and the tungsten disulfide dielectric layer prepared in step (2) to be used as the top electrode, so that a memristor of a graphene/tungsten disulfide/graphene structure is obtained, wherein the transferring method can refer to a method disclosed by the document "*Graphene transfer: key for applications*" of Junmo Kang et al (Nanoscale, 2012, 4, 5527).

(4) The graphene bottom electrode and the top electrode in the device prepared in step (3) are led out by a metal film electrode via a method of electron beam lithography and electron beam evaporation, so as to facilitate subsequent integration and measurement.

Embodiment 6

(1) Preparation of a gold bottom electrode is the same as embodiment 2.

(2) Preparation and transfer of a tungsten disulfide dielectric: firstly growing a tungsten disulfide block material by using a method of chemical vapor transmission (CVT); then stripping a tungsten disulfide film from the growing tungsten disulfide block material to the surface of the SiO$_2$/Si substrate by using a mechanical stripping method, wherein the thickness of the film is 40 nm; then transferring the tungsten disulfide film on the substrate to the gold bottom electrode prepared in step (1), wherein the transferring method can refer to a method disclosed by the document "*Graphene transfer: key for applications*" of Junmo Kang et al (Nanoscale, 2012, 4, 5527).

(3) Preparation of a gold top electrode: the preparation method of the gold top electrode is the same as that in step (1), and after preparation of the gold top electrode is completed, the memristor of a gold/tungsten disulfide/gold structure can be obtained.

Embodiment 7

(1) Preparation of a graphene bottom electrode is the same as embodiment 1.

(2) Preparation and transfer of a tungsten disulfide dielectric: growing a tungsten disulfide film by using a method of chemical vapor deposition (CVD), wherein the thickness of the film is about 40 nm; and then transferring the growing tungsten disulfide film to the graphene bottom electrode prepared in step (1).

(3) Preparation and transfer of a graphene top electrode: the preparation method of the graphene top electrode is the same as that in step (1), and after preparation of the graphene top electrode is completed, the prepared graphene film electrode is transferred to the graphene bottom electrode and the tungsten disulfide dielectric layer prepared in step (2) to be used as the top electrode, so that a memristor of a graphene/tungsten disulfide/graphene structure is obtained, wherein the transferring method can refer to a method disclosed by the document "*Graphene transfer: key for applications*" of Junmo Kang et al (Nanoscale, 2012, 4, 5527).

(4) The graphene bottom electrode and the top electrode in the device prepared in step (3) are led out by a metal film electrode via a method of electron beam lithography and electron beam evaporation, so as to facilitate subsequent integration and measurement.

Embodiment 8

(1) The preparation of the gold bottom electrode is the same as embodiment 2.

(2) Preparation and transfer of a tungsten disulfide dielectric: growing a tungsten disulfide film by using a method of chemical vapor deposition (CVD), wherein the thickness of the film is about 40 nm; and then transferring the growing tungsten disulfide film to the gold bottom electrode prepared in step (1), wherein the transferring method can refer to a method disclosed by the document "*Graphene transfer: key for applications*" of Junmo Kang et al (Nanoscale, 2012, 4, 5527).

(3) Preparation of a gold top electrode: the preparation method of the gold top electrode is the same as that in step (1), and after preparation of the gold top electrode is completed, the memristor of a gold/tungsten disulfide/gold structure can be obtained.

Embodiment 9

(1) The preparation of a graphene bottom electrode is the same as embodiment 1.

(2) Preparation and transfer of a sulfur doped tungsten disulfide dielectric: growing a sulfur doped tungsten disulfide film by using a method of chemical vapor deposition (CVD), wherein the thickness of the film is about 40 nm; and then transferring the growing sulfur doped tungsten disulfide film to the graphene bottom electrode prepared in step (1).

(3) Preparation and transfer of a graphene top electrode: the preparation method of the graphene top electrode is the same as that in step (1), and after preparation of the graphene top electrode is completed, the prepared graphene film electrode is transferred to the graphene bottom electrode and the sulfur doped tungsten disulfide dielectric layer prepared in step (2) to be used as the top electrode, so that a memristor of a graphene/sulfur doped tungsten disulfide/graphene structure is obtained, wherein the transferring method can refer to a method disclosed by the document "*Graphene transfer: key for applications*" of Junmo Kang et al (Nanoscale, 2012, 4, 5527).

(4) The graphene bottom electrode and the top electrode in the device prepared in step (3) are led out by a metal film electrode via a method of electron beam lithography and electron beam evaporation, so as to facilitate subsequent integration and measurement.

Embodiment 10

(1) The preparation of a gold bottom electrode is the same as embodiment 2.

(2) Preparation and transfer of a sulfur doped tungsten disulfide dielectric: growing a sulfur doped tungsten disulfide film by using a method of chemical vapor deposition (CVD), wherein the thickness of the film is about 40 nm; and then transferring the growing sulfur doped tungsten disulfide film to the gold bottom electrode prepared in step (1), wherein the transferring method can refer to a method disclosed by the document "*Graphene transfer: key for applications*" of Junmo Kang et al (Nanoscale, 2012, 4, 5527).

(3) Preparation of the gold top electrode: the preparation method of the gold top electrode is the same as that in step (1), and after preparation of the gold top electrode is completed, the memristor of a gold/sulfur doped tungsten disulfide/gold structure can be obtained.

Embodiment 11

(1) The preparation of a gold bottom electrode is the same as embodiment 2.

(2) Preparation of an oxygen doped molybdenum disulfide dielectric: growing an oxygen doped molybdenum disulfide film on the prepared bottom electrode by using a method of molecular beam epitaxy (MBE), wherein the thickness of the film is about 40 nm.

(3) Preparation of the gold top electrode: the preparation method of the gold top electrode is the same as that in step (1), and after preparation of the gold top electrode is completed, the memristor of a gold/oxygen doped molybdenum disulfide/gold structure can be obtained.

Embodiment 12

(1) The preparation of a gold bottom electrode is the same as embodiment 2.

(2) Preparation of a tungsten disulfide dielectric: growing a tungsten disulfide film on the prepared bottom electrode by using a method of molecular beam epitaxy (MBE), wherein the thickness of the film is about 40 nm.

(3) Preparation of a gold top electrode: the preparation method of the gold top electrode is the same as that in step (1), and after preparation of the gold top electrode is completed, the memristor of a gold/tungsten disulfide/gold structure can be obtained.

Embodiment 13

(1) The preparation of the graphene bottom electrode is the same as embodiment 1.

(2) Preparation and transfer of an oxygen doped black phosphorus dielectric: firstly growing a black phosphorus block material by using a method of chemical vapor transmission (CVT); then stripping a black phosphorus film from the growing black phosphorus block material to the surface of an SiO$_2$/Si substrate by using a mechanical stripping method, wherein the thickness of the film is about 40 nm; putting the black phosphorus film in a pure oxygen environment of atmospheric pressure, taking out after 10 minutes; and finally, transferring the oxygen doped black phosphorus film on the substrate to the graphene bottom electrode prepared in step (1), wherein the transferring method can refer to a method disclosed by the document "*Graphene transfer: key for applications*" of Junmo Kang et al (Nanoscale, 2012, 4, 5527).

Steps (3)-(4) are the same as steps (3)-(4) of embodiment 1.

Embodiment 14

(1) The preparation of a gold bottom electrode is the same as embodiment 2.

(2) Preparation and transfer of an oxygen doped black phosphorus dielectric: firstly growing a black phosphorus block material by using a method of chemical vapor transmission (CVT); then stripping a black phosphorus film from the growing black phosphorus block material to the surface of an SiO$_2$/Si substrate by using a mechanical stripping method, wherein the thickness of the film is about 40 nm; putting the black phosphorus film in a pure oxygen environment of atmospheric pressure, taking out after 10 minutes; and finally, transferring the growing oxygen doped black phosphorus film to the gold bottom electrode prepared in step (1), wherein the transferring method can refer to a method disclosed by the document "*Graphene transfer: key for applications*" of Junmo Kang et al (Nanoscale, 2012, 4, 5527).

(3) Preparation of a gold top electrode: the preparation method of the gold top electrode is the same as that in step (1), and after preparation of the gold top electrode is completed, the memristor of a gold/oxygen doped black phosphorus/gold structure can be obtained.

Embodiment 15

(1) The preparation of a graphene bottom electrode is the same as embodiment 1.

(2) Preparation and transfer of a molybdenum disulfide dielectric: firstly growing a molybdenum disulfide block material by using a method of chemical vapor transmission (CVT); then stripping a molybdenum disulfide film from the growing molybdenum disulfide block material to the surface of an SiO$_2$/Si substrate by using a mechanical stripping method; and then transferring the molybdenum disulfide film on the substrate to the graphene bottom electrode prepared in step (1), wherein the transferring method can refer to a method disclosed by the document "*Graphene transfer: key for applications*" of Junmo Kang et al (Nanoscale, 2012, 4, 5527).

(3) Preparation and transfer of a graphene top electrode: the preparation method of the graphene top electrode is the same as that in step (1), and after preparation of the graphene top electrode is completed, the prepared graphene film electrode is transferred to the graphene bottom electrode and the molybdenum disulfide dielectric layer prepared in step (2) to be used as the top electrode, so that a memristor of a graphene/molybdenum disulfide/graphene structure is obtained, wherein the transferring method can refer to a method disclosed by the document "*Graphene transfer: key for applications*" of Junmo Kang et al (Nanoscale, 2012, 4, 5527).

(4) The graphene bottom electrode and the top electrode in the device prepared in step (3) are led out by a metal film electrode via a method of electron beam lithography and electron beam evaporation, so as to facilitate subsequent integration and measurement.

Embodiment 16

(1) The preparation of a gold bottom electrode is the same as embodiment 2.

(2) Preparation and transfer of a molybdenum disulfide dielectric: firstly growing a molybdenum disulfide block material by using a method of chemical vapor transmission (CVT); then stripping a molybdenum disulfide film from the growing molybdenum disulfide block material to the surface of an SiO$_2$/Si substrate by using a mechanical stripping method, wherein the thickness of the film is about 40 nm; and then transferring the molybdenum disulfide film on the substrate to the gold bottom electrode prepared in step (1), wherein the transferring method can refer to a method disclosed by the document "*Graphene transfer: key for applications*" of Junmo Kang et al (Nanoscale, 2012, 4, 5527).

(3) Preparation of a gold top electrode: the preparation method of the gold top electrode is the same as that in step (1), and after preparation of the gold top electrode is completed, the memristor of a gold/molybdenum disulfide/gold structure can be obtained.

Embodiment 17

(1) The preparation of a graphene bottom electrode is the same as embodiment 1.

(2) Preparation and transfer of a molybdenum disulfide dielectric: firstly growing a molybdenum disulfide film by using a method of chemical vapor deposition (CVD), wherein the thickness of the film is about 40 nm; and then transferring the growing molybdenum disulfide film to the graphene bottom electrode prepared in step (1).

(3) Preparation and transfer of a graphene top electrode: the preparation method of the graphene top electrode is the same as that in step (1), and after preparation of the graphene top electrode is completed, the prepared graphene film electrode is transferred to the graphene bottom electrode and the molybdenum disulfide dielectric layer prepared in step (2) to be used as the top electrode, so that a memristor of a graphene/molybdenum disulfide/graphene structure is obtained, wherein the transferring method can refer to a method disclosed by the document "*Graphene transfer: key for applications*" of Junmo Kang et al (Nanoscale, 2012, 4, 5527).

(4) The graphene bottom electrode and the top electrode in the device prepared in step (3) are led out by a metal film electrode via a method of electron beam lithography and electron beam evaporation, so as to facilitate subsequent integration and measurement.

Embodiment 18

(1) The preparation of a gold bottom electrode is the same as embodiment 2.

(2) Preparation and transfer of a molybdenum disulfide dielectric: firstly growing a molybdenum disulfide film by using a method of chemical vapor deposition (CVD), wherein the thickness of the film is about 40 nm; and then transferring the growing molybdenum disulfide film to the gold bottom electrode prepared in step (1), wherein the transferring method can refer to a method disclosed by the document "*Graphene transfer: key for applications*" of Junmo Kang et al (Nanoscale, 2012, 4, 5527).

(3) Preparation of a gold top electrode: the preparation method of the gold top electrode is the same as that in step (1), and after preparation of the gold top electrode is completed, the memristor of a gold/molybdenum disulfide/gold structure can be obtained.

Embodiment 19

(1) Preparation of a platinum bottom electrode: firstly coating the substrate with a layer of PMMA in a spinning way by using a spin coater at the speed of 4000 r/min; exposing a stripe electrode pattern (the required electrode pattern is exposed, the remaining part is covered by photoresist, and the stripe width is 1 micrometer) in a designated position on the substrate by using a method of electron beam lithography, and developing the pattern by using a developing solution; then growing a layer of platinum metal film on the substrate by using a manner of electron beam evaporation, wherein the thickness of the film is about 40 nm; and finally putting the substrate into an acetone solution, and dissolving residual PMMA photoresist with acetone, wherein the platinum gold film on the surface of the redundant photoresist falls off from the substrate accordingly, and what is left on the substrate is a stripe platinum bottom electrode.

(2) Preparation and transfer of an oxygen doped molybdenum disulfide dielectric: firstly growing a molybdenum disulfide block material by using a method of chemical vapor transmission (CVT); then stripping a molybdenum disulfide film from the growing molybdenum disulfide block material to the surface of the $SiO_2$/Si substrate by using a mechanical stripping method, wherein the thickness of the film is about 40 nm; putting the molybdenum disulfide film to a heating table of 160° C. in the air, taking down after 1.5 hours, and transferring the oxygen doped molybdenum disulfide film on the substrate to the platinum bottom electrode prepared in step (1), wherein the oxygen doping amount of the embodiment is 15%. The transferring method can refer to a method disclosed by the document "*Graphene transfer: key for applications*" of Junmo Kang et al (Nanoscale, 2012, 4, 5527).

(3) Preparation of a platinum top electrode: the preparation method of the platinum top electrode is the same as that in step (1).

Embodiment 20

(1) Preparation of a palladium bottom electrode: firstly coating the substrate with a layer of PMMA in a spinning way by using a spin coater at the speed of 4000 r/min; exposing a stripe electrode pattern (the required electrode pattern is exposed, the remaining part is covered by photoresist, and the stripe width is 1 micrometer) in a designated position on the substrate by using a method of electron beam lithography, and developing the pattern by using a developing solution; then growing a layer of palladium metal film on the substrate by using a manner of electron beam evaporation, wherein the thickness of the film is about 40 nm; and finally putting the substrate into an acetone solution, and dissolving residual PMMA photoresist with acetone, wherein the palladium metal film on the surface of the redundant photoresist falls off from the substrate accordingly, and what is left on the substrate is a stripe platinum bottom electrode.

(2) Preparation and transfer of an oxygen doped molybdenum disulfide dielectric: firstly growing a molybdenum disulfide block material by using a method of chemical vapor transmission (CVT); then stripping a molybdenum disulfide film from the growing molybdenum disulfide block material to the surface of the $SiO_2$/Si substrate by using a mechanical stripping method, wherein the thickness of the film is about 40 nm; putting the molybdenum disulfide film to a heating table of 160° C. in the air, taking down after 1.5 hours, and transferring the oxygen doped molybdenum disulfide film on the substrate to the palladium bottom electrode prepared in step (1), wherein the oxygen doping amount of the embodiment is 15%. The transferring method can refer to a method disclosed by the document "*Graphene transfer: key for applications*" of Junmo Kang et al (Nanoscale, 2012, 4, 5527).

(3) Preparation of a palladium top electrode: the preparation method of the palladium top electrode is the same as that in step (1).

Embodiment 21

(1) Preparation of a titanium nitride bottom electrode: firstly coating the substrate with a layer of PMMA in a spinning way by using a spin coater at the speed of 4000 r/min; exposing a stripe electrode pattern (the required electrode pattern is exposed, the remaining part is covered by photoresist, and the stripe width is 1 micrometer) in a designated position on the substrate by using a method of electron beam lithography, and developing the pattern by using a developing solution; then growing a layer of titanium nitride film on the substrate by using a manner of magnetron sputtering, wherein the thickness of the film is about 40 nm; and finally putting the substrate into an acetone solution, and dissolving residual PMMA photoresist with acetone, wherein the titanium nitride film on the surface of the redundant photoresist falls off from the substrate accordingly, and what is left on the substrate is a stripe titanium nitride bottom electrode.

(2) Preparation and transfer of an oxygen doped molybdenum disulfide dielectric: firstly growing a molybdenum disulfide block material by using a method of chemical vapor transmission (CVT); then stripping a molybdenum disulfide film from the growing molybdenum disulfide block material to the surface of the $SiO_2$/Si substrate by using a mechanical stripping method, wherein the thickness of the film is about 40 nm; putting the molybdenum disulfide film to a heating table of 160° C. in the air, taking down after 1.5 hours, and transferring the oxygen doped molybdenum disulfide film on the substrate to the titanium nitride bottom electrode prepared in step (1), wherein the oxygen doping amount of the embodiment is 15%. The transferring method can refer to a method disclosed by the document "*Graphene transfer: key for applications*" of Junmo Kang et al (Nanoscale, 2012, 4, 5527).

(3) Preparation of a titanium nitride top electrode: the preparation method of the titanium nitride top electrode is the same as that in step (1).

Embodiment 22

(1) The preparation of a graphene bottom electrode is the same as embodiment 1.

(2) Preparation and transfer of an oxygen doped molybdenum disulfide dielectric: firstly growing a molybdenum disulfide block material by using a method of chemical vapor transmission (CVT); then stripping a molybdenum disulfide film from the growing molybdenum disulfide block material to the surface of an SiO$_2$/Si substrate by using a mechanical stripping method, wherein the thickness of the film is about 40 nm; and putting the molybdenum disulfide film to a heating table of 160° C. in the air, taking down after 1.5 hours, and transferring the oxygen doped molybdenum disulfide film on the substrate to the graphene bottom electrode prepared in step (1), wherein the transferring method can refer to a method disclosed by the document "*Graphene transfer: key for applications*" of Junmo Kang et al (Nanoscale, 2012, 4, 5527).

Step (3) is the same as step (3) of embodiment 2.

Embodiment 23

(1) The preparation of a gold bottom electrode is the same as embodiment 2.

(2) Preparation and transfer of an oxygen doped molybdenum disulfide dielectric: firstly growing a molybdenum disulfide block material by using a method of chemical vapor transmission (CVT); then stripping a molybdenum disulfide film from the growing molybdenum disulfide block material to the surface of an SiO$_2$/Si substrate by using a mechanical stripping method, wherein the thickness of the film is about 40 nm; and putting the molybdenum disulfide film to a heating table of 160° C. in the air, taking down after 1.5 hours, and transferring the oxygen doped molybdenum disulfide film on the substrate to the gold bottom electrode prepared in step (1), wherein the transferring method can refer to a method disclosed by the document "*Graphene transfer: key for applications*" of Junmo Kang et al (Nanoscale, 2012, 4, 5527).

Steps (3)-(4) are the same as steps (3)-(4) of embodiment 1.

Figure 8:
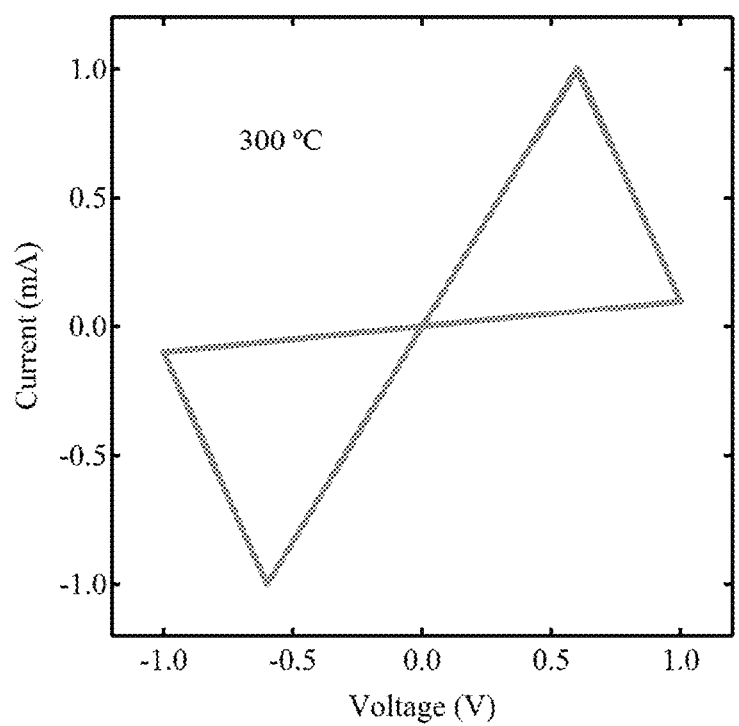
FIG. 8 is a switching curve schematic diagram of devices in embodiments 3-23 at the temperature of 300° C.
Figure 9:
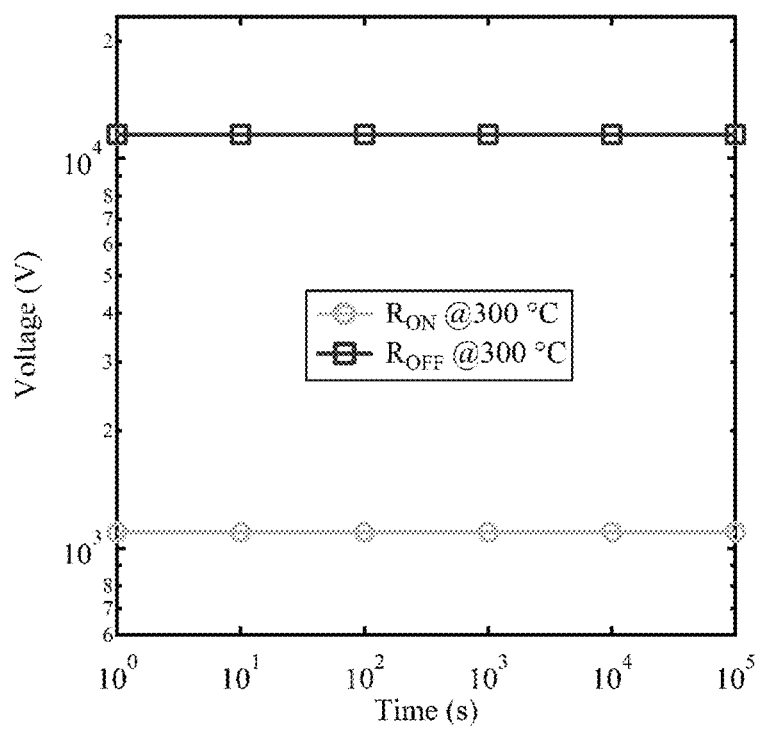
FIG. 9 is a state maintaining time schematic diagram of high and low resistance states of devices in embodiments 3-23 at the temperature of 300° C.

A switching curve schematic diagram of devices in embodiments 3-23 at the temperature of 300° C. is as shown in FIG. 8, indicating that the prepared memristor can work at the temperature of 300° C.; and a state maintaining time schematic diagram of high and low resistance states of devices in embodiments 3-23 at the temperature of 300° C. is as shown in FIG. 9, indicating that the prepared memristor can keep the internal steady resistance state for a long time at the temperature of 300° C.

Embodiment 24

Designing a Group of Parallel Test:

(1) The preparation of a graphene bottom electrode is the same as embodiment 1.

(2) Preparation and transfer of an oxygen doped molybdenum disulfide dielectric: firstly growing a molybdenum disulfide block material by using a method of chemical vapor transmission (CVT); then stripping a molybdenum disulfide film from the growing molybdenum disulfide block material to the surface of an SiO$_2$/Si substrate by using a mechanical stripping method, wherein the thickness of the film is about 40 nm; putting the molybdenum disulfide film to a heating table of 160° C. in the air (here, in order to compare the influence of different oxygen doping amounts on the device, the oxygen doping proportion can be controlled by controlling the oxidizing time of a sample when being put onto the heating table, and 10 groups of contrast tests are performed, with the oxygen doping amounts being respectively 0.1%, 5%, 10%, 20%, 25%, 30%, 35%, 40% and 50%); and after oxidization is completed, taking down the molybdenum disulfide film, and transferring the oxygen doped molybdenum disulfide film on the substrate to the graphene bottom electrode prepared in step (1), wherein the transferring method can refer to a method disclosed by the document "*Graphene transfer: key for applications*" of Junmo Kang et al (Nanoscale, 2012, 4, 5527).

Steps (3)-(4) are the same as steps (3)-(4) of embodiment 1. The influence of different oxygen doping amounts on the device is as shown in table 1.

TABLE 1

Influence of different oxygen doping amounts to the device

| | Group Number | | | | | | | | | |
|---|---|---|---|---|---|---|---|---|---|---|
| | 19-1 | 19-2 | 19-3 | 19-4 | 19-5 | 19-6 | 19-7 | 19-8 | 19-9 | 19-10 |
| Oxygen Doping Amount | 0 | 1% | 5% | 10% | 20% | 25% | 30% | 35% | 40% | 50% |
| Average Switching Times | $10^2$ | $10^3$ | $10^4$ | $10^6$ | $10^6$ | $10^5$ | $10^4$ | $10^4$ | $10^3$ | $10^2$ |

Conclusion: the influence of the oxygen doping amount to the switching frequency is an important performance index of the memristor, the oxygen doping amount will affect the switching times of the device, and it can be known from table 1 that when no oxygen is doped, the measured average switching times is $10^2$; when the oxygen doping amount is 1%, the measured average switching times is $10^3$; when the oxygen doping amount is 50%, the measured average switching times is $10^2$; when the oxygen doping amount is higher than 50%, the stability of a crystal structure of molybdenum disulfide cannot be maintained, and the device loses high temperature stability; and therefore, when the oxygen doping amount x is more than 0% and less than 50%, the average switching times are all fine, especially, when x is more than or equal to 10% and less than or equal to 20%, the average switching time is highest, and the doping amount is optimal.

What is claimed is:

1. A high temperature resistant memristor based on two-dimensional covalent crystal, which is characterized in that: the high temperature resistant memristor comprises a bottom electrode, a dielectric and a top electrode, wherein the dielectric is a two-dimensional covalent crystal material or a two-dimensional covalent crystal material doped with oxygen or sulfur; wherein the two-dimensional covalent crystal material is not soluble in water, acetone and photoresist; does not chemically react with acetone or photoresist; and has relatively high stability at high temperature.

2. The high temperature resistant memristor of claim 1, which is characterized in that: the two-dimensional covalent crystal material maintains original crystal structure at a temperature for 500° C. or higher.

3. The high temperature resistant memristor of claim 2, which is characterized in that: the two-dimensional covalent crystal material is transition metal chalcogenide or black phosphorus.

4. The high temperature resistant memristor of claim 1, which is characterized in that: the doping amount of oxygen or sulfur is x, and x is more than 0% and less than 50%.

5. The high temperature resistant memristor of claim 4, which is characterized in that: the doping amount of oxygen or sulfur is that x is more than or equal to 10% and less than or equal to 20%.

6. The high temperature resistant memristor of claim 1, which is characterized in that: the dielectric is prepared by adopting a method of chemical vapor deposition, chemical vapor transportation or molecular beam epitaxy.

7. The high temperature resistant memristor of claim 1, which is characterized in that: the bottom electrode and the top electrode are made by adopting an inert metal material, conducting material or semimetal type two-dimensional covalent crystal material.

8. The high temperature resistant memristor of claim 7, which is characterized in that: the inert metal material is platinum, gold or palladium.

9. The high temperature resistant memristor of claim 7, which is characterized in that: the conducting material is indium tin oxide or titanium nitride.

10. The high temperature resistant memristor of claim 7, which is characterized in that: the semimetal type two-dimensional covalent crystal material is graphene.

11. A method for preparing a high temperature resistant memristor comprising the following steps:
  (1) preparing a bottom electrode on a substrate by adopting a physical vapor deposition or magnetron sputtering method when an inert metal material or a flexible conducting material is adopted as the bottom electrode and a top electrode, preparing a dielectric by adopting a method of chemical vapor deposition, chemical vapor transportation or molecular beam epitaxy, transferring the dielectric to the bottom electrode, and then preparing the top electrode; and
  (2) preparing the bottom electrode and the top electrode by adopting a mechanical stripping method or a chemical vapor deposition method when a semimetal type two-dimensional covalent crystal material is adopted as the bottom electrode and the top electrode, transferring the bottom electrode to the substrate, preparing the dielectric by adopting the method of chemical vapor deposition, chemical vapor transportation or molecular beam epitaxy, transferring the dielectric to the bottom electrode, and then transferring the top electrode to the dielectric.

12. A method for preparing a high temperature resistant memristor comprising the following steps:
  (1) preparing a bottom electrode on a substrate by adopting a physical vapor deposition or magnetron sputtering method when an inert metal material or a flexible conducting material is adopted as the bottom electrode and a top electrode, preparing a precursor of a two-dimensional covalent crystal material by adopting a method of chemical vapor deposition, chemical vapor transportation or molecular beam epitaxy, then doping the two-dimensional covalent crystal material by using a doping process to obtain a dielectric, transferring the dielectric to the bottom electrode, and then preparing the top electrode; and
  (2) preparing the bottom electrode and the top electrode by adopting a mechanical stripping method or the method of chemical vapor deposition when a semimetal type two-dimensional covalent crystal material is adopted as the bottom electrode and the top electrode, transferring the bottom electrode to the substrate, preparing the precursor of the two-dimensional covalent crystal material by adopting the method of chemical vapor deposition, chemical vapor transportation or molecular beam epitaxy, then doping the two-dimensional covalent crystal material by using the doping process to obtain a dielectric, transferring the dielectric to the bottom electrode and then transferring the top electrode to the dielectric.

\* \* \* \* \*